(12) United States Patent
Koui

(10) Patent No.: US 6,498,076 B1
(45) Date of Patent: Dec. 24, 2002

(54) METHOD FOR MANUFACTURING A SEMICONDUCTOR LASER

(75) Inventor: Tomoaki Koui, Tokyo (JP)

(73) Assignee: NEC Corporation, Tokyo (JP)

( * ) Notice: Subject to any disclaimer, the term of this patent is extended or adjusted under 35 U.S.C. 154(b) by 49 days.

(21) Appl. No.: 09/593,382

(22) Filed: Jun. 15, 2000

(30) Foreign Application Priority Data

Jun. 17, 1999 (JP) .............................................. 11-171097

(51) Int. Cl.[7] .............................................. H01L 21/20
(52) U.S. Cl. ...................................... 438/479; 438/483
(58) Field of Search .............................. 438/21, 22, 24, 438/39, 40, 41, 46, 478, 483, 479

(56) References Cited

FOREIGN PATENT DOCUMENTS

| JP | 6-104527 | | 4/1994 |
| JP | 7-162093 | | 6/1995 |
| JP | 7-202317 | | 8/1995 |
| JP | 07254750 | * | 11/1995 |
| JP | 9-83077 | | 3/1997 |
| JP | 10-178232 | | 6/1998 |
| JP | 10-303499 | | 11/1998 |
| JP | 11-112102 | | 4/1999 |

OTHER PUBLICATIONS

R. Bhat, et al., "Orientation dependence of S, Zn, Si, Te, and Sn doping in OMCVD growth of InP and GaAs: application to DH lasers and lateral p–n junction arrays grown on non–planar substrates", Journal of Crystal Growth 107 (1991), pp. 772–778.

Japanese Office Action dated Jul. 18, 2001, with partial English translation.

Sakata et al., "Low Threshold and High Uniformity for Novel 1.3–um–Strained InGaAsP MQW DC–PBH LD's Fabricated by the All–Selective MOVPE Technique", IEEE Photonics Technology Letters, vol. 9, No. 3, Mar. 1997, pp. 291–293.

Extended Abstracts (The 59th Autumn Meeting, 1998); The Japan Society of Applied Physics, JSAP Catalog No.: AP981129–01, Sep. 15–18, 1998, p. 272.

* cited by examiner

Primary Examiner—Savitri Mulpuri
(74) Attorney, Agent, or Firm—McGinn & Gibb, PLLC

(57) ABSTRACT

In a method for manufacturing a semiconductor laser having a p-InP current blocking layer and an n-InP current blocking layer formed on both sides of an active layer, the length of surface migration is controlled to be not less than 1500 nm when forming the n-InP current blocking layer. This makes it possible to effectively prevent abnormal growth of the n-InP current blocking layer from taking place.

12 Claims, 5 Drawing Sheets

METHOD FOR MANUFACTURING A SEMICONDUCTOR LASER

BACKGROUND OF THE INVENTION

1. Field of the Invention

The present invention relates to a method for manufacturing a semiconductor laser comprising current blocking layers consisting of a p-type InP layer and an n-type InP layer provided on both sides of an active layer.

2. Detailed Description of the Related Art

In conventional method for manufacturing a semiconductor laser comprising current blocking layers consisting of a p-type InP layer and an n-type InP layer provided on both sides of an active layer, the semiconductor laser is formed without etching a substrate by utilizing small-width selective growth technique as described, for example, in Japanese Patent Laid-open Publication No. Hei 6-104527 and Japanese Patent Laid-open Publication No. Hei 7-162093. When growing the current blocking layers in the prior art, for example, the layers have been grown under constant growth conditions with atmospheric pressure metalorganic vapor phase epitaxy (hereinafter abbreviated as atmospheric pressure MOVPE) process without changing the growth conditions in the course of growth. However, when growing the layer under conditions of high temperature and high pressure of raw gas of group V element, for example, there has been such a problem that abnormality is generated in the configuration with the planes of the higher-order being exposed as shown in FIG. 1 due to the effect of edge growth in the vicinity of a double hetero (DH) structure. In FIG. 1, a DH structure portion 101 is formed on a InP substrate 100 and current blocking layers consisting of a p-InP current blocking layer 102 and an n-InP current blocking layer 103 are formed on the InP substrate 100 at both sides of the DH structure portion 101. An InP cladding layer 104 is formed on the entire surface. Abnormality of the current blocking layers 102, 103 is generated in the vicinity of the double hetero (DH) structure portion 101.

This problem occurs because the length of surface migration of a group III raw element on (100) plane becomes extremely short when growing the n-InP current blocking layer 103 under conditions of high temperature and high pressure of group V raw gas in the atmospheric pressure MOVPE process. FIG. 2 shows the result of quantitative evaluation of this phenomenon by an experimental method to be described later in the description of preferred embodiment of the present invention. In FIG. 2, the relationship between L(111)B and L(100) of non-doped InP and n-type InP having carrier concentration of $3 \times 10^{18}$ cm$^{-3}$ is shown by a graph. L denotes a migration length. As the graph shows, the length of surface migration is decreased significantly by n-doping. The abnormal shape shown in FIG. 1 is caused as the group III raw element is trapped in the higher-order planes before forming the (100) plane, because the length of surface migration is short in the vicinity of the DH structure during growth of the n-InP current blocking layer under conditions of high temperature and high pressure of raw gas containing group V element.

Such an abnormal shape has an adverse effect also on the device characteristics. When the abnormal shape of the higher-order planes such as (311) being exposed remains, growing of buried layer proceeds in which the growth of the higher-order planes is predominant right above the DH structure in the subsequent process of growing a p-type InP cladding layer. Meanwhile, it has been reported that the carrier concentration varies significantly with the orientation of plane by, for example, R. Bhat et. al (Journal of Crystal Growth, 107 (1991), pp772–778). Particularly in the p-type InP, efficiency of doping decreases when the growth of higher-order planes is predominant. Consequently, when the abnormal shape is formed during the growth of the n-InP current blocking layer, p-type carrier concentration decreases when growing the p-type cladding layer, leading to high resistance of the element that increases voltage drop, thus resulting in deterioration of the element characteristics.

SUMMARY OF THE INVENTION

An object of the present invention is to provide a method for manufacturing a semiconductor laser comprising a p-InP current blocking layer and an n-InP current blocking layer formed on both sides of an active layer, that is capable of effectively preventing the n-InP current blocking layer from growing abnormally.

According to the present invention, a method for manufacturing the semiconductor laser comprises the steps of selectively growing a multi-layer semiconductor film including an active layer on a predetermined region of an n-type semiconductor substrate, and forming a growth blocking film only on the multi-layer semiconductor film and forming a p-InP current blocking layer and an n-InP current blocking layer in this order on both sides of the multi-layer semiconductor film, wherein the length of surface migration is controlled to be 1500 nm or more when forming the n-InP current blocking layer.

According to this method for manufacturing the semiconductor laser, since the length of surface migration is controlled to be at least 1500 nm when forming the n-InP layer, abnormal growth of the n-type InP layer in the vicinity of the multi-layer semiconductor film including an active layer can be effectively prevented.

The present invention also provides a method for manufacturing a semiconductor laser comprising the steps of selectively growing a multi-layer semiconductor film including an active layer on a predetermined region of a p-type semiconductor substrate, and forming a growth blocking film only on the multi-layer semiconductor film and forming an n-InP current blocking layer and a p-InP current blocking layer in this order on both sides of the multi-layer semiconductor film, wherein the length of surface migration is controlled to be at least 1500 nm when forming the n-InP current blocking layer.

According to this method for manufacturing the semiconductor laser, since the length of surface migration is controlled to be not less than 1500 nm when forming the n-type InP layer, flatness of the n-type InP layer can be improved. This allows satisfactory growth of the p-type InP layer on the n-type InP layer, thus making it possible to form the current blocking layers in a designed configuration.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENTS

Preferred embodiments of the present invention will now be described in detail below with reference to the accompanying drawings. The method for manufacturing the semiconductor laser according to the present invention is characterized by the acceleration of the surface migration of group III raw element in selective growth of buried layer in the atmospheric pressure MOVPE, for the purpose of restricting the abnormal growth of the buried structure of the n-InP current blocking layer in the vicinity of the DH structure.

Figure 3:
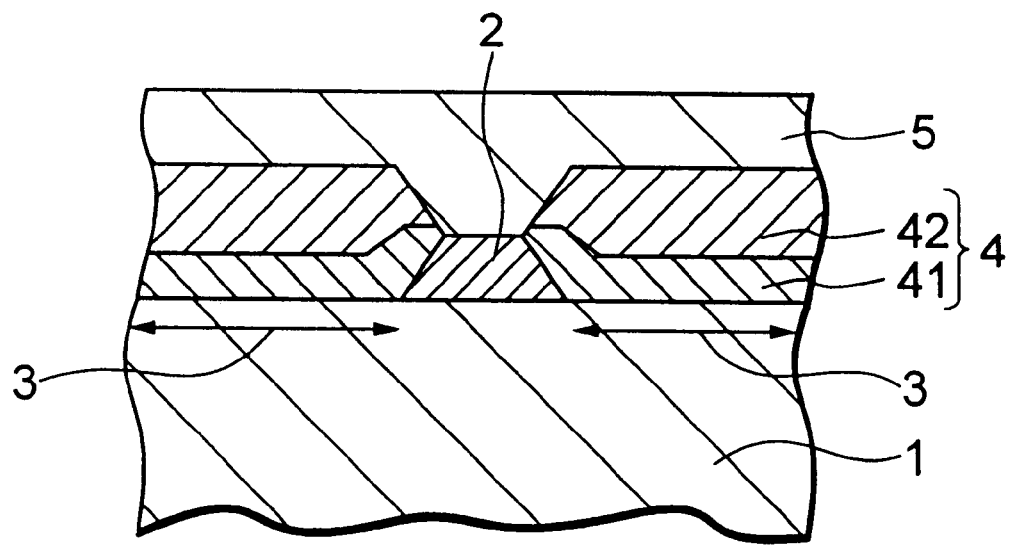
FIG. 3 is a cross sectional view of a structure according to an embodiment of the present invention.

FIG. 3 is a cross sectional view showing the semiconductor laser according to an embodiment of the present invention. On an n-type InP substrate 1 in which a double heterojunction (DH) structure portion 2 is selectively grown, an $SiO_2$ stripe mask is formed only on top of the double heterojunction structure portion 2 by self-alignment for the purpose of blocking the growth and, in the atmospheric pressure metal organic vapor phase epitaxy (MOVPE) process, InP current blocking layers 4 consisting of a p-InP current blocking layer 41 and an n-InP current blocking layer 42 are grown successively by selective buried growing process in channel regions 3 provided on both sides of the double heterojunction structure portion 2. Then the $SiO_2$ stripe mask is removed and a buried p-InP cladding layer 5 is grown.

When growing the n-InP current blocking layer 42, the surface migration of the group III raw element that is supplied is accelerated in order to restrict the abnormal growth in the vicinity of the DH structure. Specifically, the length of surface migration is controlled to 1500 nm or greater.

Figure 1:
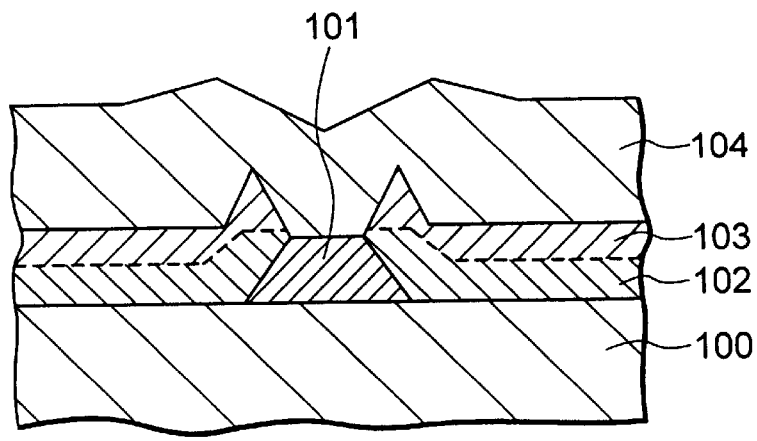
FIG. 1 is a cross sectional view of a structure of the prior art.
Figure 2:
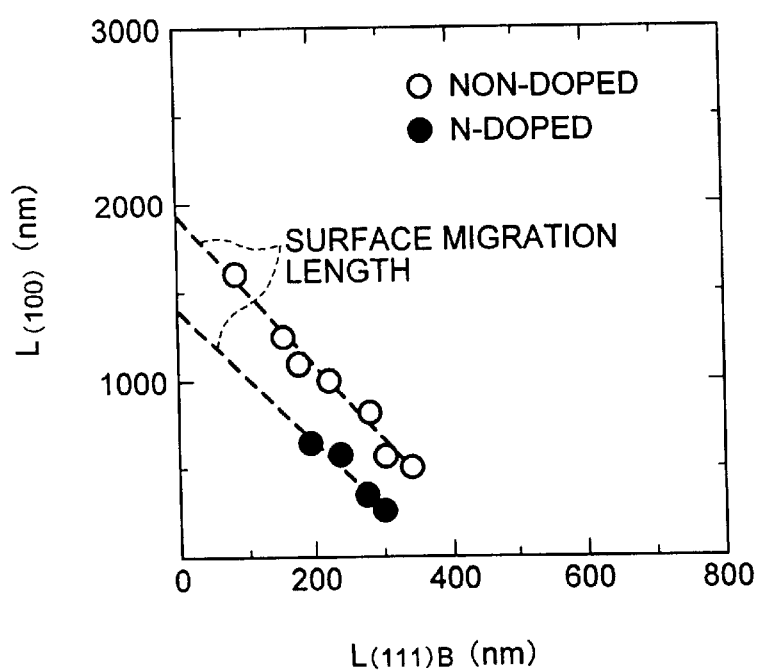
FIG. 2 is a graph showing the dependency of surface migration length on the doping concentration.
Figure 5:
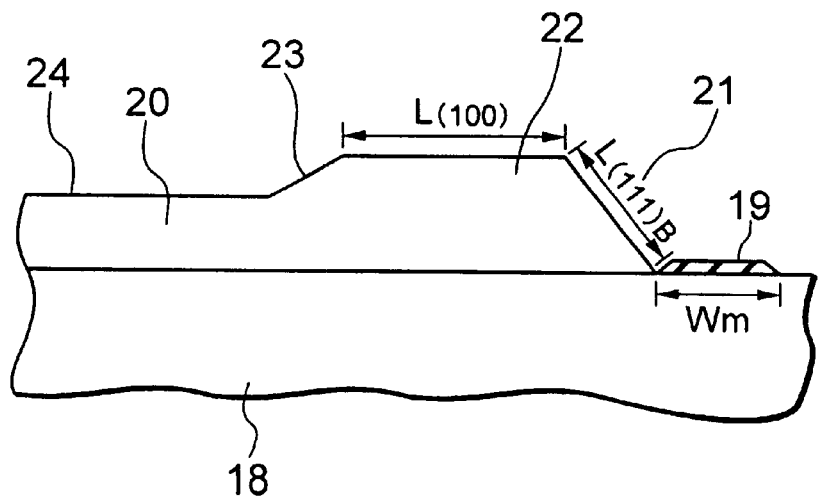
FIG. 5 is a cross sectional view of a structure showing the definition of the surface migration length.
Figure 7:
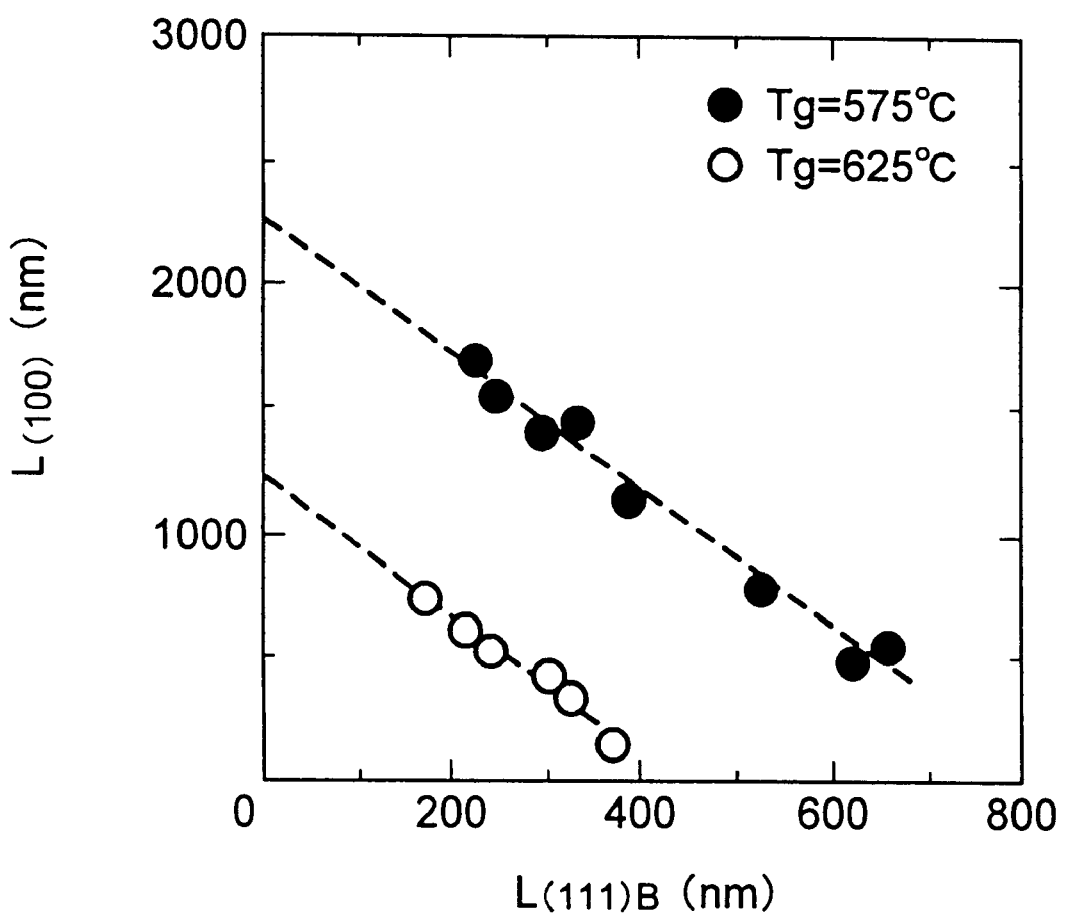
FIG. 7 is a graph showing the dependency of surface migration length on the growth temperature.

The length of surface migration in this application refers to the length over which the group III raw element that is supplied onto the substrate can move on the (100) plane before being trapped in the substrate or before making contribution to the crystal growth. The length of surface migration can be experimentally quantified by a process shown in FIG. 5. First, an $SiO_2$ stripe mask 19 having a width of Wm=1 to 60 μm is formed on the n-type (100) InP substrate 18 in the direction of [110], then an InP layer 20 is formed on the substrate by selective growth of 2000 Å, so that a (111)B plane 21, a (100) plane 22, a mildly sloped higher-order plane 23 such as (311) and the (100) plane 24 can be seen as being formed in this order from an edge of the mask when observing the cross section of InP after growth. Among these, length L(111)B of the (111)B plane 21 and length L(100) of the (100) plane 22 that adjoins the former are measured with the relation between L(111)B and L(100) graphed as shown in FIG. 2 or FIG. 7. Value of L(100) when L(111)B is zero represents the surface migration length of an ideal group III raw element, namely In, on the (100) plane. Now, (111) plane generally contains eight planes of (111) plane, (11-1) plane, (1-11) plane, (-111) plane, (1-1-1) plane, (-11-1) plane, (-1-11) plane and (-1-1-1) plane. In a compound semiconductor such as InP, (111)B plane denotes (11-1) plane, (1-11) plane, (-111) plane and (-1-1-1) plane. The upper most surface of the (111)B plane of the InP compound semiconductor is covered with V group raw element.

According to the present invention, the n-type InP layer can be formed, for example, by MOVPE process using $PH_3$ as the stock gas. The MOVPE process is preferably atmospheric pressure MOVPE process. The current blocking layer can be formed with good controllability when such a film forming process is employed.

The feature of the present invention is that the surface migration length is controlled when forming (growing) the n-type InP layer. As specific measures for controlling the surface migration length, it is effective to control the growth temperature and control the partial pressure of $PH_3$ that is the raw gas. For this reason, according to the present invention, film forming temperature for the n-type InP layer is preferably controlled in a range from 550 to 600° C. and more preferably in a range from 560 to 590° C. Also when forming the n-type InP layer, partial pressure of $PH_3$ is preferably controlled in a range from 0.1 to 2 Torr, more preferably in a range from 0.2 to 1 Torr. This makes it possible to increase the surface migration length.

According to the present invention, the surface migration length is preferably controlled to be 1500 nm or more, more preferably 2000 nm or more. Although there is no upper limit, it suffices to limit the surface migration length to 5000 nm or less.

According to the present invention, although there is no limitation to the structure of the multi-layer semiconductor film that includes the active layer, double-heterojunction structure (DH) is preferable.

Now the method for manufacturing the semiconductor laser according to this embodiment will be described below with reference to FIGS. 4A through 4E.

Figure 4A:
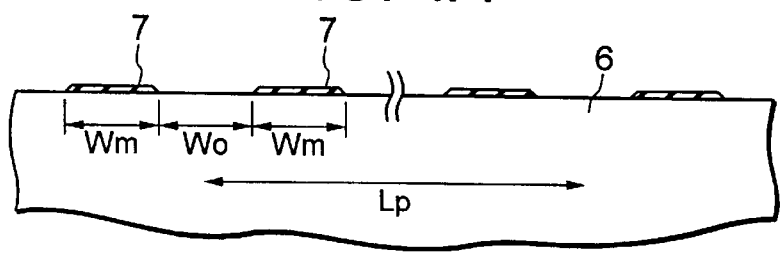
FIGS. 4A through 4E are cross sectional views showing the manufacturing method of FIG. 3.

As shown in FIG. 4A, a pair of $SiO_2$ stripe masks 7 having mask width Wm and aperture width Wo is formed on the (100) n-type InP substrate 6 in the direction of [011] with a period of Lp as shown in FIG. 4A.

Figure 4B:
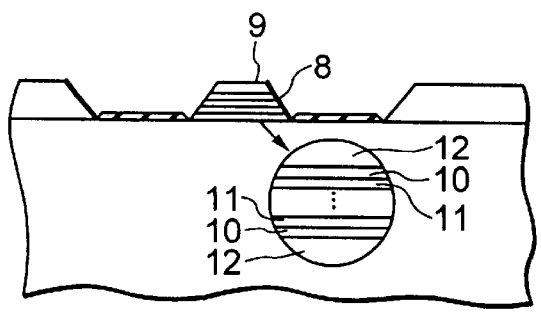

Then as shown in FIG. 4B, double-heterojunction structure (hereinafter abbreviated as DH structure) 9 that includes a multiple quantum well structure (hereinafter abbreviated as MQW structure) is selectively grown by atmospheric pressure metal organic vapor phase epitaxy process (hereinafter abbreviated as atmospheric pressure MOVPE). Dimensions are set as Wm=0 to 200 μm, more preferably from 0 to 50 μm and Wo=0 to 10 μm, more preferably from 0 to 5 μm, while Lp=0 to 1000 μm, more preferably from 100 to 500 μm. In the MQW structure 8, for example, a well layer 10 comprises a 7-layer InGaAsP layer having band gap wavelength of 1.27 m with thickness of 5 nm and compressive strain of 0.7% and a barrier layer 11 comprises an InGaAsP layer having band gap wavelength of 1.13 μm with thickness of 8 nm, while InGaAsP-SCH layers 12 having band gap wavelength of 1.13 μm with thickness of 60 nm are disposed on and under the MQW structure 8.

Figure 4C:
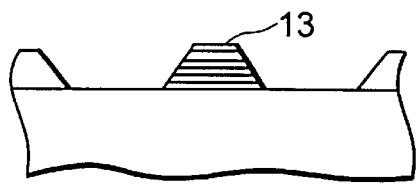

Then as shown in FIG. 4C, the $SiO_2$ stripe mask 7 is removed and an $SiO_2$ stripe mask 13 is formed only on the top of the DH structure portion 9 with the self-alignment technique.

Figure 4D:
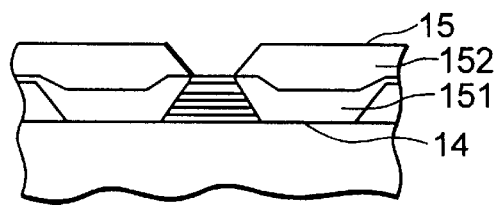

Then buried InP current blocking layers 15 are selectively grown on channel regions 14 provided on both sides of the DH structure portion 9 by atmospheric pressure MOVPE process, as shown in FIG. 4D. The InP current blocking layers 15 have such a structure as, for example, a p-InP current blocking layer 151 (carrier concentration of $5 \times 10^{17}$ cm$^{-3}$ and film thickness 0.4 µm) and an n-InP current blocking layer 152 (carrier concentration of $3 \times 10^{18}$ cm$^{-3}$ and film thickness 0.6 µm) are stacked.

Figure 4E:
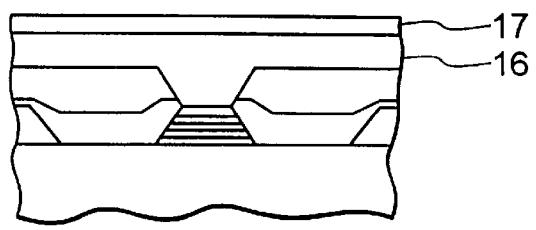

Then as shown in FIG. 4E, the SiO$_2$ stripe mask 13 is removed and an InP cladding layer 16 that covers the entire substrate and an InGaAs electrode contact layer 17 are grown as buried by the atmospheric pressure MOVPE process. The InP cladding layer 16 is made of, for example, p-type InP (carrier concentration of $1 \times 10^{18}$ cm$^{-3}$ and film thickness 4.5 µm) and the InGaAs electrode contact layer 17 is made of, for example, p-type InGaAs (carrier concentration of $1 \times 10^{19}$ cm$^{-3}$ and film thickness 0.5 µm). However, this structure is shown as a mere example, and optimum structure naturally varies depending on the application of the device.

Figure 6:
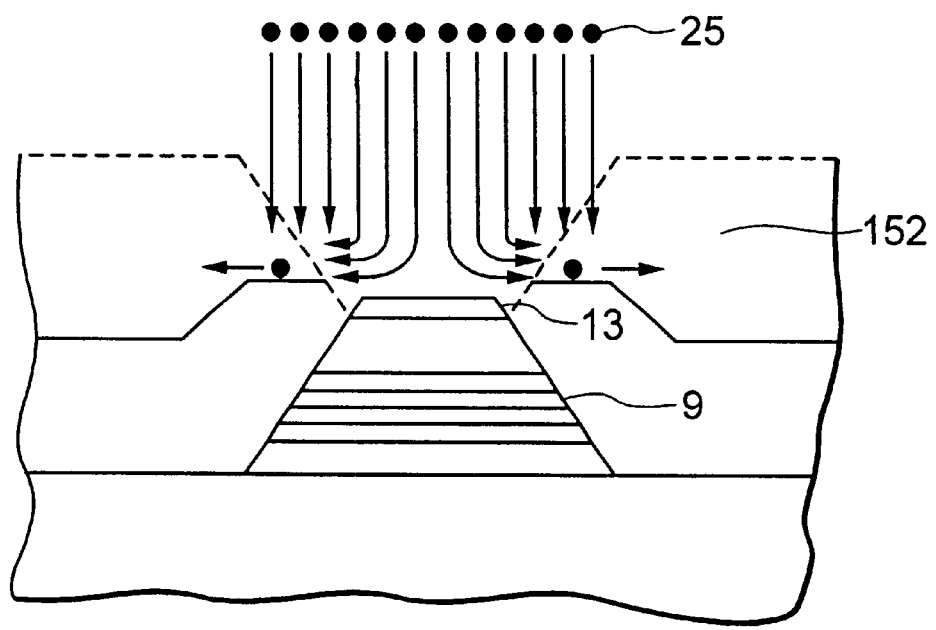
FIG. 6 is a cross sectional view of a structure showing the behavior of group III raw element during growth of n-InP current blocking layer.

In this embodiment, when growing the n-InP current blocking layer 152, such growth conditions are set as the surface migration length of group III raw element that is supplied increases for the purpose of restricting the abnormal growth in the vicinity of the DH structure. FIG. 6 shows the movement of group III raw element during the growth of the n-InP current blocking layer 152. The group III raw element 25 supplied at a position right above the DH structure portion 9 does not penetrate the substrate because of the presence of the SiO$_2$ stripe mask 13 and is, instead, supplied into the regions on both sides of the DH structure. As a result, the regions on both sides of the DH structure portion 9 contain the group III raw element with higher concentration. In order to restrict abnormal shape from being formed in the vicinity of regions on both sides of the DH structure portion 9, it suffices to set such growth conditions as the surface migration length of the group III raw element increases. This is because it becomes easier to form the (100) plane and such a situation does not occur as the group III raw elements 25 is taken into the growing layer only in the vicinity of the DH structure portion 9.

FIGS. 4A through 4E show the specific process of forming the n-InP current blocking layer 152. In order to accelerate the surface migration of the group III raw element that is supplied and restrict the abnormal growth in the vicinity of the DH structure during selective growth of buried layer in the atmospheric pressure MOVPE process, it suffices to decrease the effective pressure of the group V stock gas during the growing process. When the heavy temperature dependency of the decomposition efficiency of PH$_3$ that is the group V raw element is taken advantage of, the decomposition efficiency at 575° C. is about one tenth that at the conventional growth temperature of 625° C. Thus decreasing the growth temperature leads to lower pressure of the group V raw element, making it possible to increase the surface migration length of the group III raw element.

FIG. 7 shows the result of evaluating the migration length. It can be seen that decreasing the growth temperature by 50° C. causes the migration length to increase by a factor of 2. Trimethyl indium (TMI) is used for the group III raw element, phosphine (PH$_3$) is used for the group V raw element and disilane (Si$_2$H$_6$) is used for the n-type dopant, with the growing pressure being the normal atmospheric pressure.

Another embodiment of the present invention will now be described below. In this embodiment, pressure of the group V raw element itself is changed. Surface migration length of the group III raw element can be controlled by the pressure of the group V raw element that is supplied simultaneously. That is, surface migration length of the group III raw element can be increased by decreasing the pressure of the gas containing the group V raw element. While the pressure of the raw gas containing group V element during growth is set to about 6.0 Torr in the prior art, this embodiment sets the group V gas pressure when growing the n-InP current blocking layer 152 to 0.6 Torr. Decreasing the group V gas pressure to about one tenth enables it to achieve sufficiently long surface migration length of the group III raw element.

While the surface migration length of the group III raw element is increased by differentiating the growth temperature in the first embodiment and the partial pressure of the group V raw gas (PH$_3$) in the second embodiment, greater effect can be achieved by controlling both the growth temperature and the partial pressure of the group V raw gas (PH$_3$).

Although the foregoing description of the embodiments relates to the device structure provided on the n-type InP substrate, similar effects can be expected from a device provided on a p-type InP substrate simply by changing the conductivity type. That is, since flatness of the n-type InP layer can be improved, the p-type InP layer can be satisfactorily formed thereon thus making it possible to form the current blocking layer in the designed configuration.

As described above, the present invention makes it possible to restrict the formation of abnormal shape in the vicinity of the DH structure. This is because, although concentration of the group III raw element in the regions on both sides of the DH structure is higher due to the effect of selective growth when growing the n-InP current blocking layer, such a situation does not occur as the group III raw element is taken into the growing layer only in the vicinity of the DH structure, thus making it easier to form the (100) plane, because the effective pressure of the group V raw element during growth is decreased by low-temperature growth and such growth conditions that increase the surface migration length of the group III raw element are employed.

The present invention also makes it possible to improve the element characteristics. This is because variations of the carrier concentration in the layer, due to the formation of the higher-order planes such as the (311) plane in the n-InP current blocking layer and in the p-type InP cladding layer that grows thereafter, can be decreased by suppressing the formation of abnormal shape in the vicinity of the DH structure of the n-InP current blocking layer.

While there has been described what are at present considered to be preferred embodiments of the invention, it will be understood that various modifications may be made thereto, and it is intended that the appended claims cover all such modification as fall within the true spirit and scope of the invention.

What is claimed is:

1. A method for manufacturing a semiconductor laser comprising the steps of:

selectively growing a multi-layer semiconductor film including an active layer in predetermined regions of an n-type semiconductor substrate; and for a growth blocking layer only on said multi-layer semiconductor film and forming a p-InP current blocking layer and an n-InP current blocking layer in this order on both sides of the multi-layer semiconductor film, wherein the length of surface migration of a group III raw element for said n-InP current blocking layer on the (100) plane is controlled to be 1500 nm or more when forming said n-InP current blocking layer by selective growth of a buried layer wherein length of the surface migration is controlled by at least one of a film growth temperature and partial pressure of group V raw element.

2. A method for manufacturing a semiconductor laser comprising the steps of:

selectively growing a multi-layer semiconductor film including an active layer in predetermined regions of a p-type semiconductor substrate; and forming a growth blocking layer only on said multi-layer semiconductor film and forming an n-InP current blocking layer and a p-InP current blocking layer in this order on both sides of said multi-layer semiconductor film, wherein the length of surface migration of a group III raw element for said n-InP current blocking layer on the (100) plane is controlled to be 1500 nm or more when forming said n-InP current blocking layer by selective growth of a buried layer wherein length of the surface migration is controlled by at least one of a film growth temperature and partial pressure of group V raw element.

3. A method for manufacturing a semiconductor laser according to claim 1, wherein said n-InP current blocking layer is formed by selective growth of a buried layer in an atmospheric pressure MOVPE process using $PH_3$ as the group V raw gas.

4. A method for manufacturing a semiconductor laser according to claim 2, when said n-InP current blocking layer is formed by selective growth of a buried layer in an atmospheric pressure MOVPE process using $PH_3$ as the group V raw gas.

5. A method for manufacturing a semiconductor laser according to claim 3, wherein film growth temperature is set in a range from approximately 550 to 600° C. when forming said n-InP current blocking layer by selective growth of a buried layer in an atmospheric pressure MOVPE process.

6. A method for manufacturing a semiconductor laser according to claim 4, wherein film growth temperature is set in a range from approximately 550 to 600° C. when forming said n-InP current blocking layer by selective growth of a buried layer in an atmospheric pressure MOVPE process.

7. A method for manufacturing a semiconductor laser according to claim 3, wherein the partial pressure of $PH_3$ is set in a range from approximately 0.1 to 2 Torr when forming said n-InP current clocking layer by selective growth of a buried layer in an atmospheric pressure MOVPE process.

8. A method for manufacturing a semiconductor laser according to claim 4, wherein the partial pressure of $PH_3$ is set in a range from approximately 0.1 to 2 Torr when forming said n-InP current blocking layer by selective growth of a buried layer in an atmospheric pressure MOVPE process.

9. A method for manufacturing a semiconductor laser according to claim 3, wherein a primary growth plane for the blocking layer in the vicinity of said multi-layer semiconductor film is in the (100) plane.

10. A method for manufacturing a semiconductor laser according to claim 4, wherein a primary growth plane for the blocking layer in the vicinity of said multi-layer semiconductor film is in the (100) plane.

11. A method for manufacturing a semiconductor laser according to claim 4, wherein the group V raw element comprises phosphine.

12. A method for manufacturing a semiconductor laser according to claim 4, wherein the group V raw element comprises phosphine.

* * * * *